US012621934B2

(12) United States Patent
White et al.

(10) Patent No.: US 12,621,934 B2
(45) Date of Patent: May 5, 2026

(54) ELECTRONIC CIRCUIT DEVICE HAVING CLOSED-CORE INDUCTORS IN SIDE-BY-SIDE RELATION AND ASSOCIATED METHODS

(71) Applicant: HARRIS GLOBAL COMMUNICATIONS, INC., Albany, NY (US)

(72) Inventors: Mark D. White, Rochester, NY (US); Ben Willistein, Bloomfield, NY (US); Joseph D. Majkowski, Pittsford, NY (US); Barrett Bartell, Mendon, NY (US); John Russell, Honeoye Falls, NY (US)

(73) Assignee: HARRIS GLOBAL COMMUNICATIONS, INC., Albany, NY (US)

( * ) Notice: Subject to any disclaimer, the term of this patent is extended or adjusted under 35 U.S.C. 154(b) by 282 days.

(21) Appl. No.: 18/589,491

(22) Filed: Feb. 28, 2024

(65) Prior Publication Data

US 2025/0275061 A1    Aug. 28, 2025

(51) Int. Cl.
| | |
|---|---|
| *H05K 1/18* | (2026.01) |
| *H01F 17/06* | (2006.01) |
| *H01F 27/28* | (2006.01) |
| *H01F 41/02* | (2006.01) |
| *H05K 1/181* | (2026.01) |

(52) U.S. Cl.
CPC ............. *H05K 1/181* (2013.01); *H01F 17/06* (2013.01); *H01F 27/28* (2013.01); *H01F 41/02* (2013.01); *H05K 2201/1003* (2013.01)

(58) Field of Classification Search
CPC ........ H01F 17/06; H01F 17/062; H01F 41/02; H05K 1/184; H05K 2201/049; H05K 2201/1003
See application file for complete search history.

(56) References Cited

U.S. PATENT DOCUMENTS

| | | | |
|---|---|---|---|
| 5,386,194 A | 1/1995 | Moehlmann | |
| 7,002,074 B2 | 2/2006 | Settergren et al. | |
| 7,057,486 B2 | 6/2006 | Kiko | |
| 7,598,839 B1 * | 10/2009 | Wedley .................. | H01F 27/30 336/212 |
| 8,185,081 B2 | 5/2012 | Russell et al. | |
| 8,779,868 B2 | 7/2014 | White | |
| 2009/0237193 A1 | 9/2009 | Wedley | |
| 2010/0134228 A1 | 6/2010 | Chow et al. | |

(Continued)

FOREIGN PATENT DOCUMENTS

| | | |
|---|---|---|
| CN | 103050222 A | 4/2013 |
| CN | 111724968 A | 9/2020 |

*Primary Examiner* — Nathan Milakovich
(74) *Attorney, Agent, or Firm* — ALLEN, DYER, DOPPELT, + GILCHRIST, P.A. Attorneys at Law

(57) ABSTRACT

An electronic circuit device may include a main circuit board having an inductor assembly mounting area thereon, and an inductor assembly coupled to the main circuit board adjacent the inductor assembly mounting area. The inductor assembly may include an inductor assembly circuit board with an inductor assembly circuit board though-opening therein, and closed-core inductors coupled to the inductor assembly circuit board in side-by-side relation and having lower portions extending into the inductor assembly circuit board though-opening.

23 Claims, 6 Drawing Sheets

(56)     References Cited

U.S. PATENT DOCUMENTS

| | | | |
|---|---|---|---|
| 2010/0214050 A1 | 8/2010 | Opina, Jr. et al. | |
| 2010/0284160 A1* | 11/2010 | Gutierrez | H05K 3/303 |
| | | | 29/592.1 |
| 2012/0058676 A1 | 3/2012 | Schaffer et al. | |
| 2012/0119864 A1 | 5/2012 | Lint | |
| 2018/0294086 A1* | 10/2018 | Lin | H05K 7/20909 |
| 2021/0274655 A1* | 9/2021 | Jin | H01F 27/2804 |
| 2021/0280354 A1* | 9/2021 | Xiong | G06F 1/183 |

* cited by examiner

ELECTRONIC CIRCUIT DEVICE HAVING CLOSED-CORE INDUCTORS IN SIDE-BY-SIDE RELATION AND ASSOCIATED METHODS

FIELD OF THE INVENTION

The present invention relates to the field of electronic circuit devices, and more particularly, to an electronic circuit device having an inductor assembly coupled to a circuit board and related methods.

BACKGROUND OF THE INVENTION

Many modern electronic circuit devices may require high quality factor (high-Q) components, such as inductors that have low energy loss and high performance in filters and oscillators. For example, a direct Radio Frequency (RF) sampling receiver may require high-Q inductors that operate with low noise amplifiers as a filter before the RF analog-to-digital conversion (ADC) that directly digitizes the RF signal. Many other electronic circuit devices may also use high-Q inductors. In most cases, these inductors are difficult to mount because of the limited space on a printed circuit board. The high-Q inductors may also be associated with a Virtual Path Cross-Connect (VPX) card having limited height and width, and thus, limited board space for mounting the inductors. Additionally, with some printed circuit board designs, the circuit board header and package tolerances limit the area on which high-Q inductors can be placed.

Many surface-mounted closed-core inductors employ printed circuit board carriers, but even with these improved packaging techniques, surface-mounted closed-core inductors require a relatively large printed circuit board area, especially when a large array of inductors are used for circuit performance. When larger arrays of multiple inductors are placed on a printed circuit board, there is often unused space between them, which is inefficient and unnecessary. Thus, in many electronic circuit device designs, there is a limit to the density that high-Q inductors can achieve on a printed circuit board, and this limit is usually a mechanical issue, and not an electrical issue.

SUMMARY OF THE INVENTION

In general, an electronic circuit device may comprise a main circuit board having an inductor assembly mounting area thereon. An inductor assembly may be coupled to the main circuit board adjacent the inductor assembly mounting area. The inductor assembly may comprise an inductor assembly circuit board having an inductor assembly circuit board through-opening therein, and a plurality of closed-core inductors coupled to the inductor assembly circuit board in side-by-side relation and having lower portions extending into the inductor assembly circuit board through-opening.

Each closed-core inductor may comprise a toroidally-shaped core and a winding associated therewith, for example. The inductor assembly circuit board may comprise an assembly dielectric layer having a lower side adjacent the main circuit board and an upper side opposite the lower side, a lower set of contact areas on the lower side of the assembly dielectric layer, and an upper set of contact areas on the upper side of the assembly dielectric layer and coupled to the plurality of closed-core inductors. A set of interconnecting traces may extend between the lower and upper sets of contact areas. The set of interconnecting traces may comprise a plurality of castellated vias, in some embodiments. The main circuit board may comprise a main dielectric layer and a set of contact areas on an upper side thereof coupled to the lower set of contact areas.

Each closed-core inductor may have a medial opening therein. The inductor assembly may comprise an elongate member having opposing ends coupled to the inductor assembly circuit board and extending through the medial openings of the plurality of closed-core inductors. The elongate member may comprise a conductive material and may be coupled to a circuit ground. The inductor assembly may comprise a respective spacer between adjacent ones of the plurality of closed-core inductors. A chassis connector may be coupled to an end of the main circuit board, and another circuit board may be positioned opposing the main circuit board and coupled to the chassis connector.

Another aspect is directed to a method of making an inductor assembly to be coupled to a main circuit board adjacent an inductor assembly mounting area thereof. The method may comprise forming an inductor assembly circuit board having an inductor assembly circuit board through-opening therein, and coupling a plurality of closed-core inductors to the inductor assembly circuit board in side-by-side relation and having lower portions extending into the inductor assembly circuit board through-opening.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout.

Figure 1:
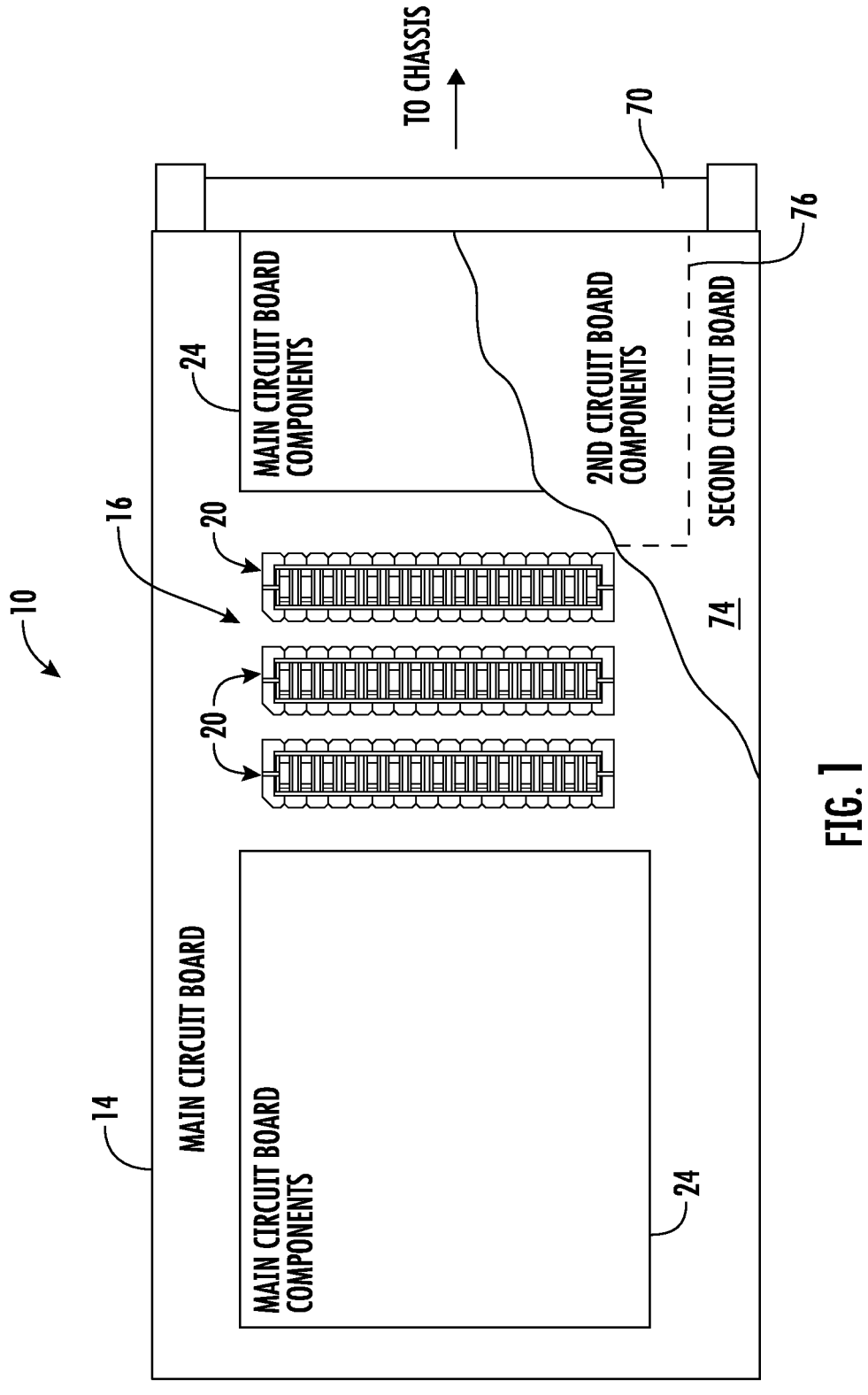
FIG. 1 is a plan view of an electronic circuit device having an inductor assembly coupled to a main circuit board according to the invention.

Referring now to FIG. 1, there is illustrated generally at 10 an electronic circuit device that includes a main circuit board 14 having an inductor assembly mounting area 16 thereon, and an inductor assembly 20 coupled to the main circuit board adjacent the inductor assembly mounting area. In the plan view of the electronic circuit device 10 of FIG. 1, three inductor assemblies 20 are shown arranged in parallel to each other on the main circuit board 14. Two blocks shown in outline at 24 indicate where other electronic main circuit board components may be positioned on the main circuit board 14. These main circuit board components 24 may be unique for a specific function of the electronic circuit device 10, such as a bandpass filter, digital discriminator, direct RF sampling receiver, and other circuits that take advantage of the functional benefits of the inductor assembly 20 that provides a compact high-Q inductor array and with high isolation between adjacent inductors for enhanced electrical performance.

Figure 2:
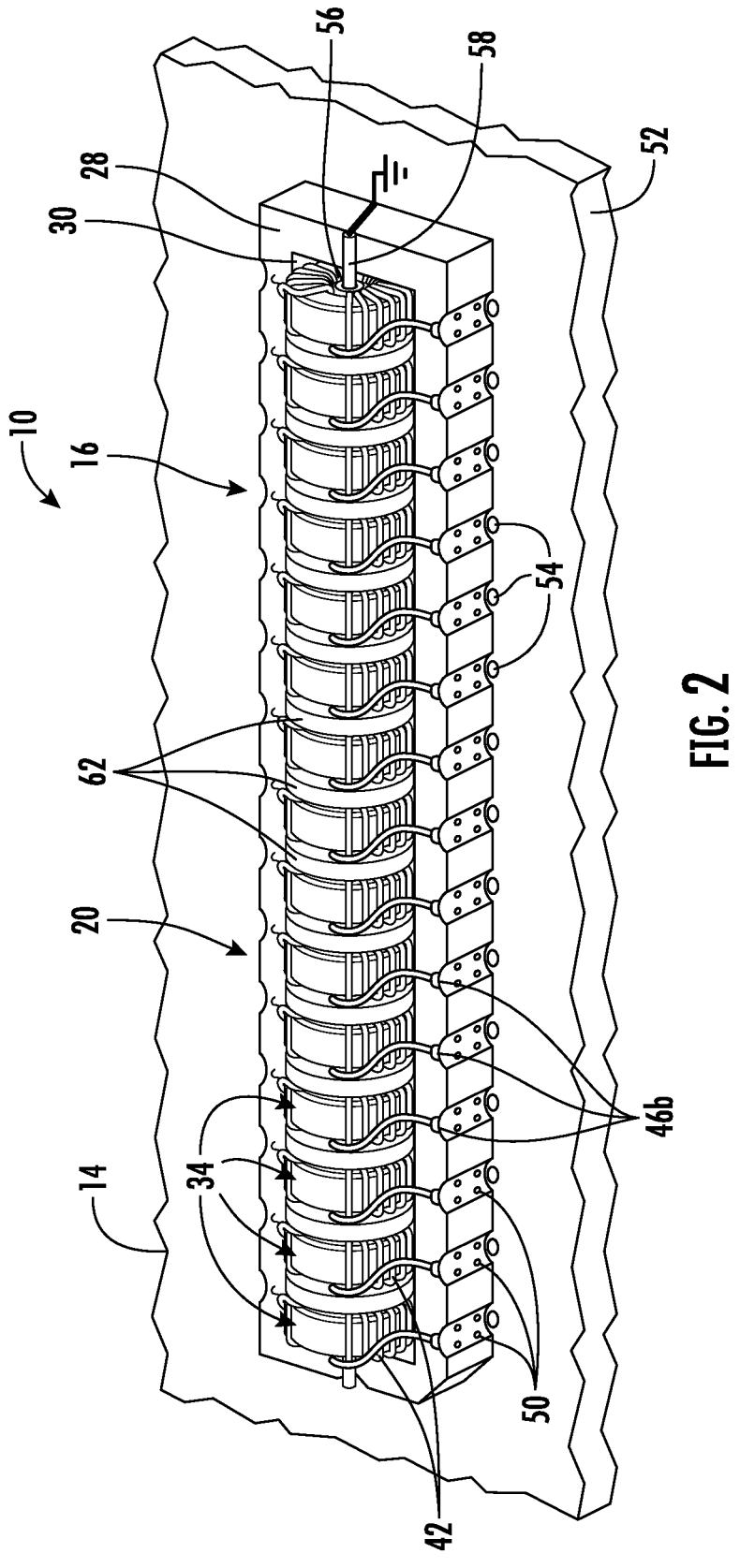
FIG. 2 is a top isometric view of the inductor assembly coupled to the main circuit board shown in a partial cut-out view.
Figure 3:
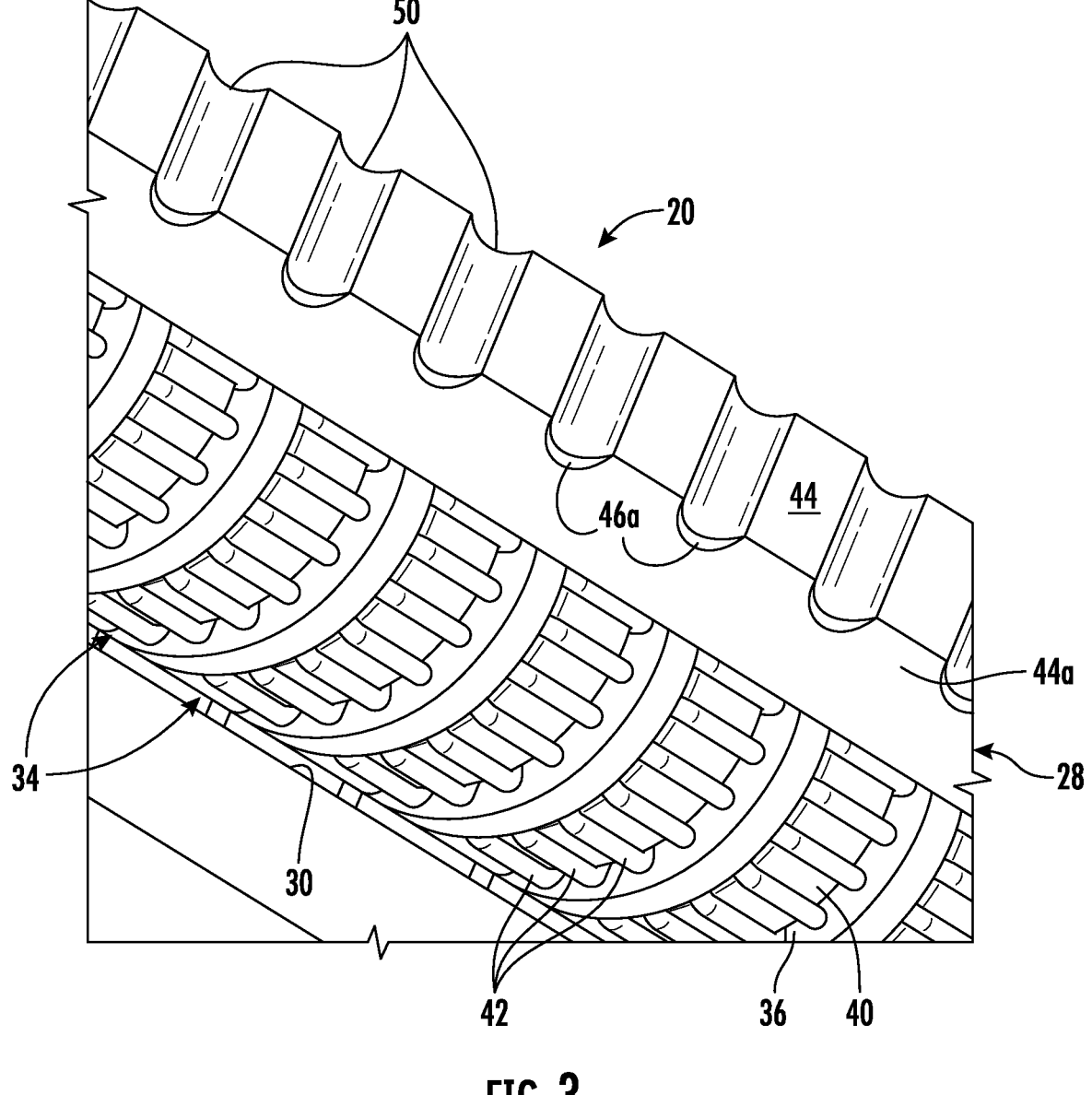
FIG. 3 is a bottom isometric view of the inductor assembly showing closed-core inductors extending into the inductor assembly circuit board through-opening.

The inductor assembly 20 is shown in greater detail in the top isometric view of FIG. 2 and the bottom isometric view of FIG. 3, illustrating an inductor assembly circuit board 28 having an inductor assembly circuit board through-opening 30 therein. A plurality of closed-core inductors 34 are mounted to the inductor assembly circuit board 28 in side-by-side relation, and have a portion 36 of the core 40 extending into the inductor assembly circuit board through-opening 30 (FIG. 3).

Figure 4:
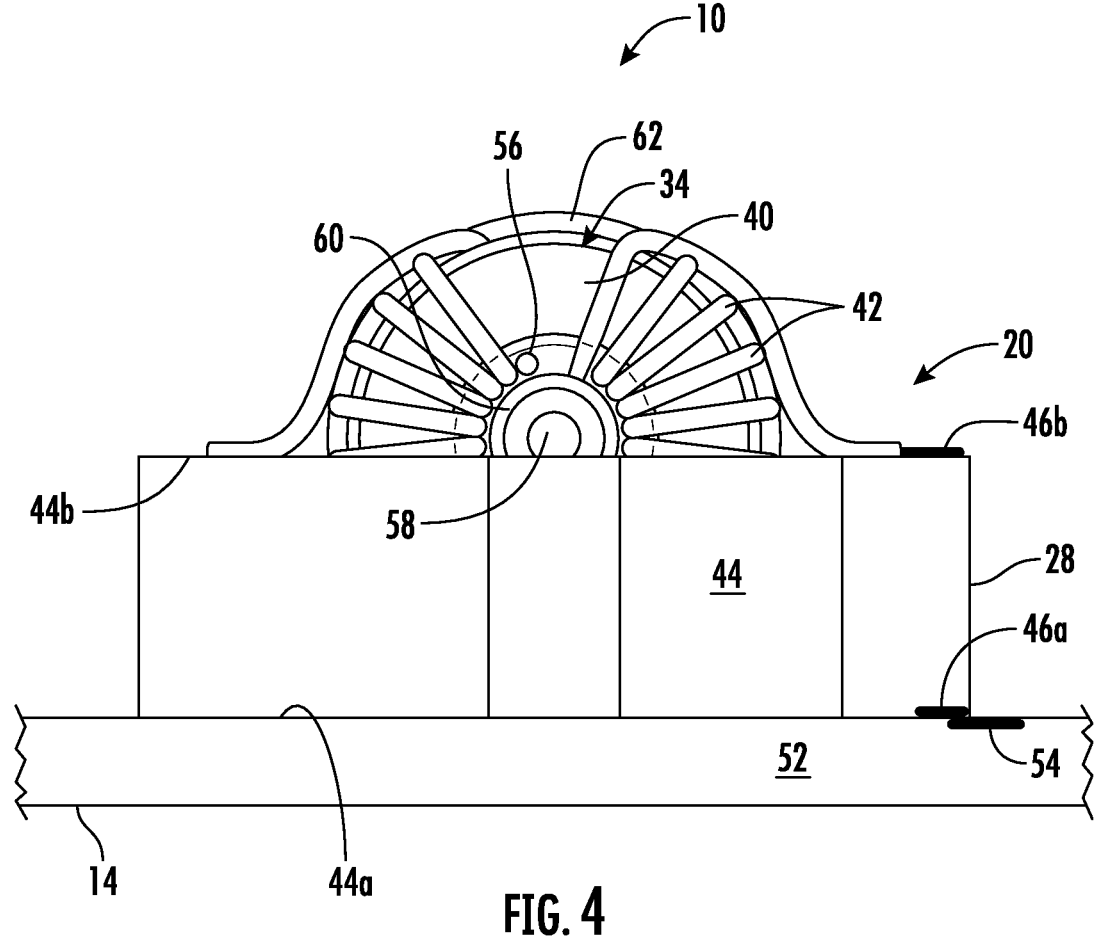
FIG. 4 is an end view in elevation of the inductor assembly coupled to the main circuit board.

Each closed-core inductor 34 may be formed as a toroi-dally-shaped core 40 as best shown in the end elevation view of FIG. 4 and a winding 42 associated therewith. As also shown in FIG. 4, the inductor assembly circuit board 28 includes an assembly dielectric layer 44 having a lower side 44a adjacent the main circuit board 14 and an upper side 44b opposite the lower side. A lower set 46a of contact areas are on the lower side 44a of the assembly dielectric layer 44 and an upper set 46b of contact areas are on the upper side 44b of the assembly dielectric layer and coupled to the plurality of closed-core inductors 34. A set of interconnecting traces 50 extend between the lower and upper set of contact areas 46a, 46b, and as shown in the illustrated embodiment of FIGS. 2 and 3, are formed as a plurality of castellated vias, also known as castellations. Castellations may have a plu-rality of different geometries with a common function of constituting interconnecting traces. The main circuit board 14 (FIGS. 2 and 4) includes a main dielectric layer 52 and a set of contact areas 54 on an upper side thereof. This set of contact areas 54 are coupled to the lower set of contact areas 46a.

Each closed-core inductor 34 includes a medial opening 56 therein (FIG. 4). The inductor assembly 20 includes an elongate member 58 (FIG. 2) having opposing ends coupled to the inductor assembly circuit board 28 and extending through the medial openings 56 of the plurality of closed-core inductors 34. The elongate member 58 may be formed of a conductive material coupled to a circuit ground, and in an example, the elongate member is formed from 22-gauge (AWG) wire, which supports the closed-core inductors 34. The grounded elongate member 58 may help reduce any possible coupling between the closed-core inductors 34 as toroids. Sleeving 60 (FIG. 4) may be placed around the elongate member 58 as the wire that supports the closed-core inductors 34 such that the vertical height of the closed-core inductors are raised relative to the inductor assembly circuit board through-opening 30. The lower portion 36 of the closed-core inductors 34 may be raised a few millimeters or more off the top surface of the main circuit board 14 by sizing of the sleeving 60 when the inductor assembly 20 is coupled to the main circuit board. In an example, the sleeving 60 may be formed from polytetrafluoroethylene or similar material.

A dielectric spacer 62 may be positioned between adja-cent ones of the plurality of closed-core inductors 34 (FIG. 2) to hold the closed-core inductors as toroids in a prede-termined spacing based upon any functional and high-Q requirements of the inductor assembly 20. In some inductor assemblies 20, spacers 62 may be formed of other materials or may not be necessary depending on the functional circuit requirements at the electronic circuit device 10.

A chassis connector 70 (FIG. 1) may be coupled to an end of the main circuit board 14, and another or second circuit board 74 positioned opposing the main circuit board and coupled to the chassis connector. The second circuit board 74 is illustrated in a fragmentary view with the dashed lines 76 indicating second circuit board components that may connect to the chassis connector 70. In this example, the two circuit boards as the first or main circuit board 14 and another or second circuit board 74 may fit together and be sized for insertion into a single VPX slot, for example, a 3U VPX circuit board with about a ¼ inch spacing between the two boards.

The electronic circuit device 10 may include a plurality of inductor assemblies 20, such as illustrated in FIG. 1 showing three inductor assemblies positioned in parallel to each other that operate as a series of filters. Example filters or other inductor applications include a direct RF sampling receiver that applies direct digital conversion (DDC) to isolate target signals, or a stand-alone receiver and/or transmitter that attaches to a power amplifier, such as a 150 watt HF/VHF power amplifier sold under the L3Harris Technologies, Inc. RF-5833H series, also used in the AN/PRC-160 wideband HF/VHF manpack radios. Numerous other applications that may use high-Q inductors as with the inductor assembly 20 may include tunable bandpass filters, digital discriminators, adjustable impedance matching networks, and similar cir-cuits as will be appreciated by those skilled in the art.

In the example shown in FIG. 2, the inductor assembly 20 is about 2 inches long and includes 15 closed-core inductors 34 that are spaced from each other via the spacers 62. Although 15 closed-core inductors 34 are illustrated, it should be understood that the number of closed-core induc-tors can vary depending on the functional end use require-ments of the electronic circuit device 10, the number or type of filters required in the device, and the inductive reactance required in the array of inductor assemblies 20. The inductor assembly circuit board 28 in an example is about 0.4 inches wide and 0.25 inches high from the lower side 44a of the assembly dielectric layer 44 to the top of the closed-core inductor 34.

The inductor assembly 20 with its plurality of closed-core inductors 34 forms a high-Q inductor array that significantly increases inductor density and provides a daughter inductor assembly circuit board 28 that permits compact mounting on the main circuit board 14.

Figure 5:
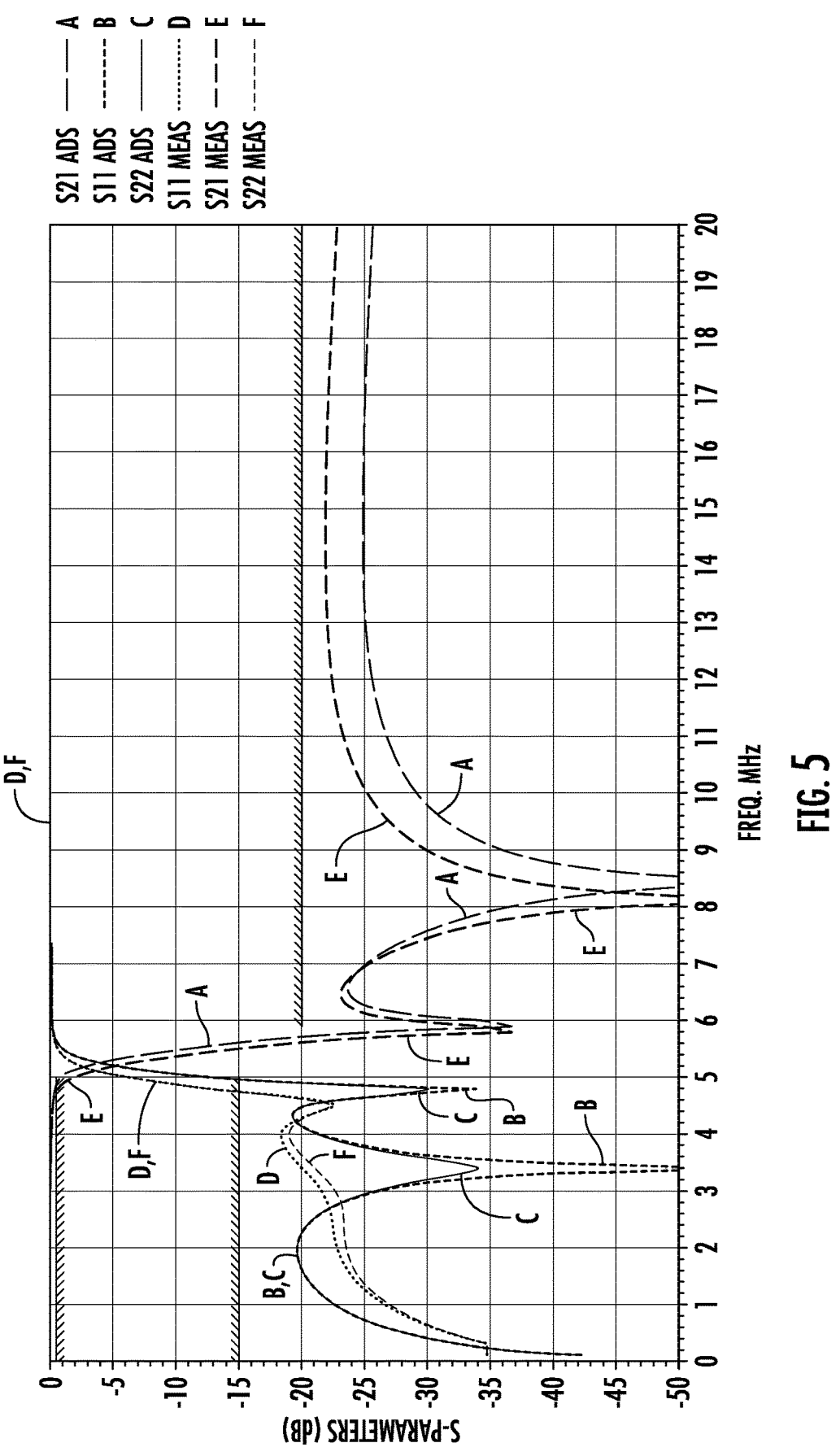
FIG. 5 is a graph showing example S-parameters for an inductor assembly according to the invention.

Referring now to FIG. 5, there is illustrated a graph of S-parameters showing on the vertical axis S-parameters in decibels and on the horizontal axis the frequency in mega-hertz. Results for the predicted or simulated S21, S11, and S22 ADS and the measured S11, S21, and S22 show the positive filter response of an example inductor assembly 20 in conjunction with additional components on the main circuit board 24. In this example, S11 and S22 correspond to reflection coefficients and S21 corresponds to transmission coefficients. The graph illustrates that signals are well main-tained in the bandpass region and strongly attenuated in a rejected band.

Figure 6:
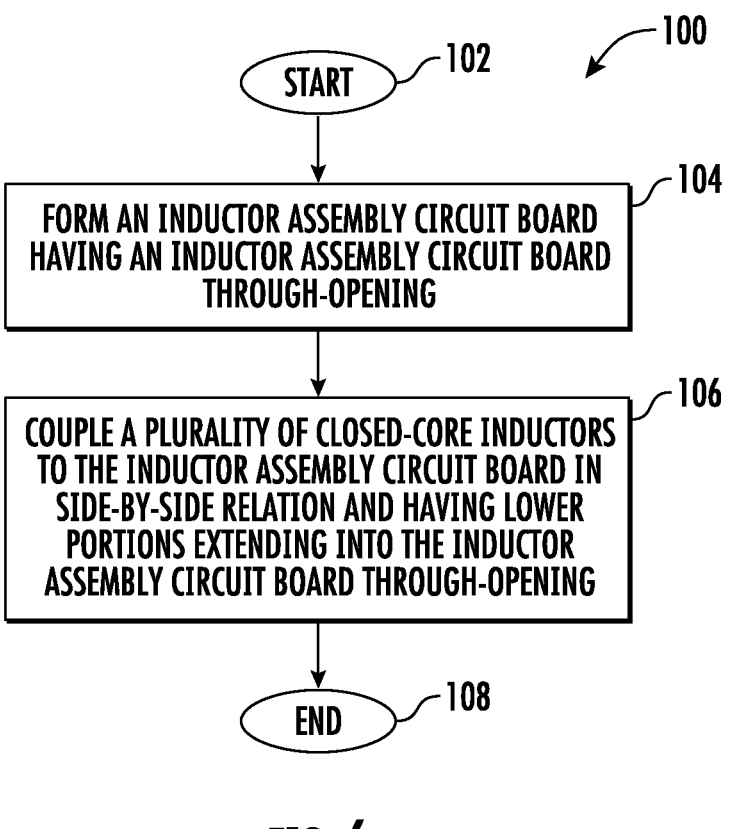
FIG. 6 is a high-level flowchart of a method of making the inductor assembly.

Referring now to FIG. 6, there is illustrated a flowchart for a method of making an inductor assembly 20 to be coupled to a main circuit board 14 adjacent an inductor assembly mounting area 16 thereof. The process starts (Block 102). The method includes forming an inductor assembly circuit board 28 having an inductor assembly circuit board through-opening 30 therein (Block 104). The method further includes coupling a plurality of closed-core inductors 34 to the inductor assembly circuit board 28 in side-by-side relation having lower portions 36 extending into the inductor assembly circuit board through-opening (Block 106). The process ends (Block 108).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. An electronic circuit device comprising:
   a main circuit board having an inductor assembly mounting area thereon;
   an inductor assembly coupled to the main circuit board adjacent the inductor assembly mounting area, the inductor assembly comprising
      an inductor assembly circuit board having an inductor assembly circuit board through-opening therein, and
      a plurality of closed-core inductors coupled to the inductor assembly circuit board in side-by-side relation and having lower portions extending into the inductor assembly circuit board though-opening.

2. The electronic device of claim 1, wherein each closed-core inductor comprises a toroidally-shaped core and a winding associated therewith.

3. The electronic device of claim 1, wherein the inductor assembly circuit board comprises:
   an assembly dielectric layer having a lower side adjacent the main circuit board and an upper side opposite the lower side;
   a lower set of contact areas on the lower side of the assembly dielectric layer;
   an upper set of contact areas on the upper side of the assembly dielectric layer and coupled to the plurality of closed-core inductors; and
   a set of interconnecting traces extending between the lower and upper sets of contact areas.

4. The electronic device of claim 3, wherein the set of interconnecting traces comprises a plurality of castellated vias.

5. The electronic device of claim 3, wherein the main circuit board comprises a main dielectric layer and a third set of contact areas on an upper side thereof coupled to the lower set of contact areas.

6. The electronic device of claim 1, wherein each closed-core inductor has a medial opening therein; and wherein the inductor assembly comprises an elongate member having opposing ends coupled to the inductor assembly circuit board and extending through the medial openings of the plurality of closed-core inductors.

7. The electronic device of claim 6, wherein the elongate member comprises a conductive material coupled to a circuit ground.

8. The electronic device of claim 1, wherein the inductor assembly comprises a respective spacer between adjacent ones of the plurality of closed-core inductors.

9. The electronic device of claim 1, comprising:
   a chassis connector coupled to an end of the main circuit board; and
   another circuit board positioned opposing the main circuit board and coupled to the chassis connector.

10. An electronic circuit device comprising:
   a circuit board having a through-opening therein;

a plurality of inductors, the inductors having a closed-core, the inductors coupled to the circuit board in side-by-side relation and having a portion of the cores extending into the through-opening; and
   the circuit board having conductive traces for each inductor.

11. The electronic device of claim 10, wherein each closed-core inductor comprises a toroidally-shaped core and a winding associated therewith.

12. The electronic device of claim 10, wherein the circuit board comprises:
   an assembly dielectric layer having a lower side and an upper side opposite the lower side;
   a lower set of contact areas on the lower side of the assembly dielectric layer;
   an upper set of contact areas on the upper side of the assembly dielectric layer and coupled to the plurality of closed-core inductors; and
   a set of interconnecting conductive traces extending between the lower and upper sets of contact areas.

13. The electronic device of claim 10, wherein the conductive traces comprise a plurality of castellated vias.

14. The electronic device of claim 10, wherein each closed-core inductor has a medial opening therein; and comprising an elongate member having opposing ends coupled to the circuit board and extending through the medial openings of the plurality of closed-core inductors.

15. The electronic device of claim 14, wherein the elongate member comprises a conductive material configured to be coupled to a circuit ground.

16. The electronic device of claim 10, wherein a respective spacer is positioned between adjacent ones of the plurality of closed-core inductors.

17. A method of making an inductor assembly to be coupled to a main circuit board adjacent an inductor assembly mounting area thereof, the method comprising:
   forming an inductor assembly circuit board having an inductor assembly circuit board through-opening therein; and
   coupling a plurality of closed-core inductors to the inductor assembly circuit board in side-by-side relation and having lower portions extending into the inductor assembly circuit board through-opening.

18. The method of claim 17, wherein each closed-core inductor comprises a toroidally-shaped core and a winding associated therewith.

19. The method of claim 17, wherein forming the inductor assembly circuit board comprises:
   forming a lower set of contact areas on a lower side of an assembly dielectric layer;
   forming an upper set of contact areas on an upper side of the assembly dielectric layer and coupled to the plurality of closed-core inductors; and
   forming a set of interconnecting traces extending between the lower and upper sets of contact areas.

20. The method of claim 19, wherein forming the set of interconnecting traces comprises forming a plurality of castellated vias.

21. The method of claim 17, wherein each closed-core inductor has a medial opening therein; and comprising coupling opposing ends of an elongate member to the inductor assembly circuit board and extending through the medial openings of the plurality of closed-core inductors.

22. The method of claim 21, wherein the elongate member comprises a conductive material configured to be coupled to a circuit ground.

23. The method of claim 17, comprising coupling a respective spacer between adjacent ones of the plurality of closed-core inductors.

* * * * *